United States Patent [19]

Blair et al.

[11] Patent Number: 4,468,565

[45] Date of Patent: Aug. 28, 1984

[54] AUTOMATIC FOCUS AND DEFLECTION CORRECTION IN E-BEAM SYSTEM USING OPTICAL TARGET HEIGHT MEASUREMENTS

[75] Inventors: William W. Blair, Stormville; Samuel K. Doran, Wappingers Falls; Guenther O. Langner, Hopewell Junction, all of N.Y.

[73] Assignee: International Business Machines Corporation, Armonk, N.Y.

[21] Appl. No.: 336,204

[22] Filed: Dec. 31, 1981

[51] Int. Cl.³ .................... B23Q 15/12; G01B 11/14
[52] U.S. Cl. .................... 250/491.1; 250/492.3; 219/121 ES; 219/121 EW
[58] Field of Search ............ 250/491.1, 397, 398, 250/492.2, 492.3; 378/206; 219/121 EW, 121 ES

[56] References Cited

U.S. PATENT DOCUMENTS 4,039,824 8/1977 Nanba .................... 250/201
4,334,139 6/1982 Wittekoek .................... 219/121

OTHER PUBLICATIONS

S. Wittekoek "Step and Repeat Wafer Imaging" *Semiconductor Microlithography V* SPIE Proceedings, vol. 221 (Mar. 17-18, 1980) pp. 5-6.

*Primary Examiner*—Janice A. Howell
*Assistant Examiner*—Constantine Hannaher
*Attorney, Agent, or Firm*—Sughrue, Mion, Zinn, Macpeak and Seas

[57] ABSTRACT

An automatic focus correction system for E-beam lithography uses optical light from a narrow angle light source to illuminate a horizontal slit, the image of which is projected onto a target surface. Prior to and after reflection of the slit image from the target surface the light beam is projected parallel to the target surface to minimize vertical space requirements in the E-beam column. Variations in height, z-position, cause the slit image to move vertically and the focus of reflection to shift laterally and this image is redeflected in the horizontal plane by a prism to a linear diode array used to produce a video-type output signal. Autofocus electronics are used to convert the video output signal into an analog correction signal to the E-beam fine focus coil. The video-type signal is also converted to a digital height value to be used for corrections in beam magnification and rotation.

11 Claims, 3 Drawing Figures

FIG. 3  AUTO FOCUS ELECTRONICS

AUTOMATIC FOCUS AND DEFLECTION CORRECTION IN E-BEAM SYSTEM USING OPTICAL TARGET HEIGHT MEASUREMENTS

BACKGROUND OF THE INVENTION

1. Field of the Invention

This invention relates to E-beam lithography and particularly to a correction system for the elimination of variations of the height of the wafer or mask surfaces which tend to degrade focus (image quality) and deflection magnification and rotation (unregistered writing).

2. Prior Art

Focused electron beam lithography exposure tools are well known in the manufacture of integrated circuit technology. Such lithography exposure tools utilize a focused beam of light or electrons and maintain optimum image quality only within a very limited range of focus. This range of focus is defined as the depth of focus of the light or electron lens system. Typically, in the case of electron beam systems, the E-beam is accelerated to a high velocity and then converged into a fine beam by means of an electron lens system where it is simultaneously deflected and scanned in two dimensions utilizing a scanning coil. In such scanning systems, the E-beam does not land perpendicular to the target due to properties of the deflection system. Consequently, such scanning systems suffer from positioning errors of the spot onto the target in those situations where the distance of the target plane, vis-a-vis the optical system reference varies. This deviation in the z-direction is significant in the scanning of processed wafers. Such a wafer may have a number of chip sites, each site being at a slightly different elevation due to surface variations in the wafer, caused by diffusion, oxidation, annealing and other processing steps. In E-beam lithography tools, the wafers are in a vacuum environment and therefore vacuum chucks cannot be used to bring all the exposure sites into a flat plane.

Within the prior art, various techniques have been proposed for focusing E-beam systems. In U.S. Pat. Nos. 3,876,883; 3,901,814; and 4,199,688, techniques are disclosed to attain optimum focus by using signals produced by the electron beam itself. Such systems require the preparation of the specimens (i.e., wafers, chromium masks) with, for example, registration marks or special targets containing an aperture to which the electron beam must be directed when focus is to be optimized. This is shown specifically in the '688 patent. Other techniques use electron beam projection systems which electron-optically image a mask onto the wafer. Accordingly, focus is determined by the concept of mask projection. Such systems materially add to the complexity of the E-beam lithography process by requiring additional process steps in the preparation of specimens. Moreover, such techniques add additional steps per se into the E-beam processing sequence and therefore tend to delay the exposure cycle of the system. Throughput therefore tends to degrade.

Prior art systems employing light-optical imaging apparatus are also known, for example, as described in U.S. Pat. Nos. 3,967,109 and 4,039,824. In such systems, optimum focus is attained based on contrast generating optical properties of the object to be brought into focus, for example, slides, photographic scenes, or the like. The variation of the contrast and the image as a result of the deviation from the correct focus is utilized. In such light-optical systems step and repeat cameras are employed for projection and a sensor for determining z-error is usually incorporated in a servoloop. In such a closed loop system, if a z-error is sensed, some countermeasure, that is, movement of either the object or the focusing system, is initiated until the error is minimized.

These prior art systems also have a number of deficiencies when applied to blank wafers or chromium masks since contrast generating properties cannot generally be utilized. These devices do not have surfaces capable of generating sufficient contrast.

Light-optical step and repeat exposure systems are known which use a different auto focus method, for example, in the GEC Corporation system 3600, 3696, and 4800 cameras. Those systems utilize a light lever technique incorporating a slit light image reflecting from the surface of the target. Accordingly, the plate surface is used as a reference plane which tends to compensate for standard plate manufacturing thickness variations and tolerances together with plate surface irregularities at the photo mask image plane. A detection circuit is used to actuate a z-axis drive to change the elevation of a printer tube in which a reduction lens is mounted.

In such systems, the optical portion generally employs a light source comprising a series of alternately triggered LED's whose light is transmitted through a slit and deflected by a 45° mirror onto the target. After reflection from the target surface the light passes through a piece of plane parallel glass pivoting on an axis to change the apparent location of the slit as it is reflected off the target mirror and thus change the angle of reflection to the receiver side back to the nominal angle resulting when the target plane has the nominal distance from the objective lens. The receiver side generally receives the light reflected through the slit from the surface to be scanned through a barrel lens, through another 45° mirror and to an autofocus reticle. An autofocus drive mechanism is driven in either direction until the receiver senses light in both halves of the reticle. The receiver, a photo diode, receives a signal which is then amplified and sent to the servo amplifier feeding a servo motor which drives the system into a position of focus and is mechanically coupled to the pivoting plane-parallel glass plate. A rate sensor is utilized to stabilize the autofocus mechanism at a "home" position and is necessary to prevent the linear motor from continually over-driving this position. Therefore, such a system tends to dither in a continuous oscillation about the focus position. Such systems where the actuator is directly fed back to the sensor are known as closed-loop or feedback systems.

Such devices are not readily useful in E-beam systems since the E-beam cannot simply substitute for a light beam in such a system. The corresponding elements and effects are entirely different for light and for electrons. In particular, the electron beam impinging on the target surface would be scattered into a large spatial angle rather than reflected into a narrow beam. Moreover, these electrons would expose the resist. But, even if the situation could be made, the devices would not be fast enough to avoid delay in the exposure cycle. Accordingly, in E-beam exposure tools, the use of feedback techniques have not found application. There are also a number of criteria in addition to processing speed tending to limit application of prior art devices. A system for measuring the z-position of the target surface, for example, the mask or wafer, must not interfere with the E- beam or its sensors, the back scatter diodes. Also, the light which is used for the measurement technique must be in a part of the spectrum to which the resist is insensitive.

Moreover, the system must be physically compatible with the E-beam structure. It must, for example, be compatible with the high vacuum requirements in which the system operates and should not contain ferromagnetic materials or bulk conductors which tend to generate unwanted Eddy currents. Given the space requirements in a E-beam system, the z-direction focus device must be accommodated within a very limited space.

With the extreme accuracy requirements (2 $\mu$m or less) the system must demonstrate high reproducible accuracy. Moreover, because of the variety of mask and wafer devices to be processed, variations in the reflectivity of the target surface must be compensated for automatically. In addition, the system must be useful in the absence of any registration marks or other aiding features on the target surface.

As indicated, given these diverse requirements, feedback devices are simply unusable. Rather, a device for measuring the z-position of the target surface must utilize some transducer technique for transforming a measurement of z-position into a correction of the focus signal, whether this be current for magnetic lenses or voltage for electrical lenses. Moreover, real time deflection correction must be accomplished utilizing computing circuitry.

SUMMARY OF THE INVENTION

Given the shortcomings in the prior art, it is an object of this invention to provide an automatic focus system for E-beam lithography systems that directly measures z-position to provide a direct focus input to the system.

It is another object of this invention to provide an automatic focus system for E-beam systems that is fully compatible with the environmental and space limitations of E-beam columns.

Yet another object of this invention is to provide a device for measuring the z-position of a target without the use of a feedback nulling circuit.

Still another object of this invention is to provide a device that automatically provides focus signals for an E-beam to compensate for elevational differences in different targets. The present invention is related to an automatic focus system for use in E-beam lithography and specifically, the system utilizes three component subsystems. The first is a device for measuring the z-position of the target surface, such as a wafer or mask. To achieve this height measurement, a narrow beam-divergence LED light source is used to illuminate a horizontal slit, the image of which is projected onto the center of surface of interest when available, a red light CW lasing diode may be used with advantage. The light beam is parallel to the surface to minimize vertical space requirements. Variations in the z-position of the surface cause the slit image to move laterally. The image is redeflected into the horizontal plane again utilizing a prism, and focused onto a second component, a transducer for transforming the optical signal into an electronic signal used for correction of the focus signal.

That is, in accordance with this invention, the optical image is directed to a linear diode array which produces a video type output signal. This signal is converted by an autofocus electronic subsystem, the third component, to an analog correction signal for correcting the E-beam focus via that systems's fine focus coil.

Finally, the system utilizes a computer to produce real time deflection correction so that magnification and image rotation are maintained while not delaying the exposure cycle of the E-beam. Computer control circuitry signals the autofocus subsystem at such a time in the processing sequence where the tool is in a mode of non-utilization, such as "table move" and therefore a focus correction signal may be applied to the fine focus coil. The video-type signal is also converted to a digital height value which is used for corrections to beam magnification and rotation.

This invention will be described in greater detail by referring to the accompanying drawings and the description of the preferred embodiment which follows.

BRIEF DESCRIPTION OF THE DRAWINGS

FIG. 3 is a block diagram showing the autofocus electronics.

DESCRIPTION OF THE PREFERRED EMBODIMENT

Figure 1:
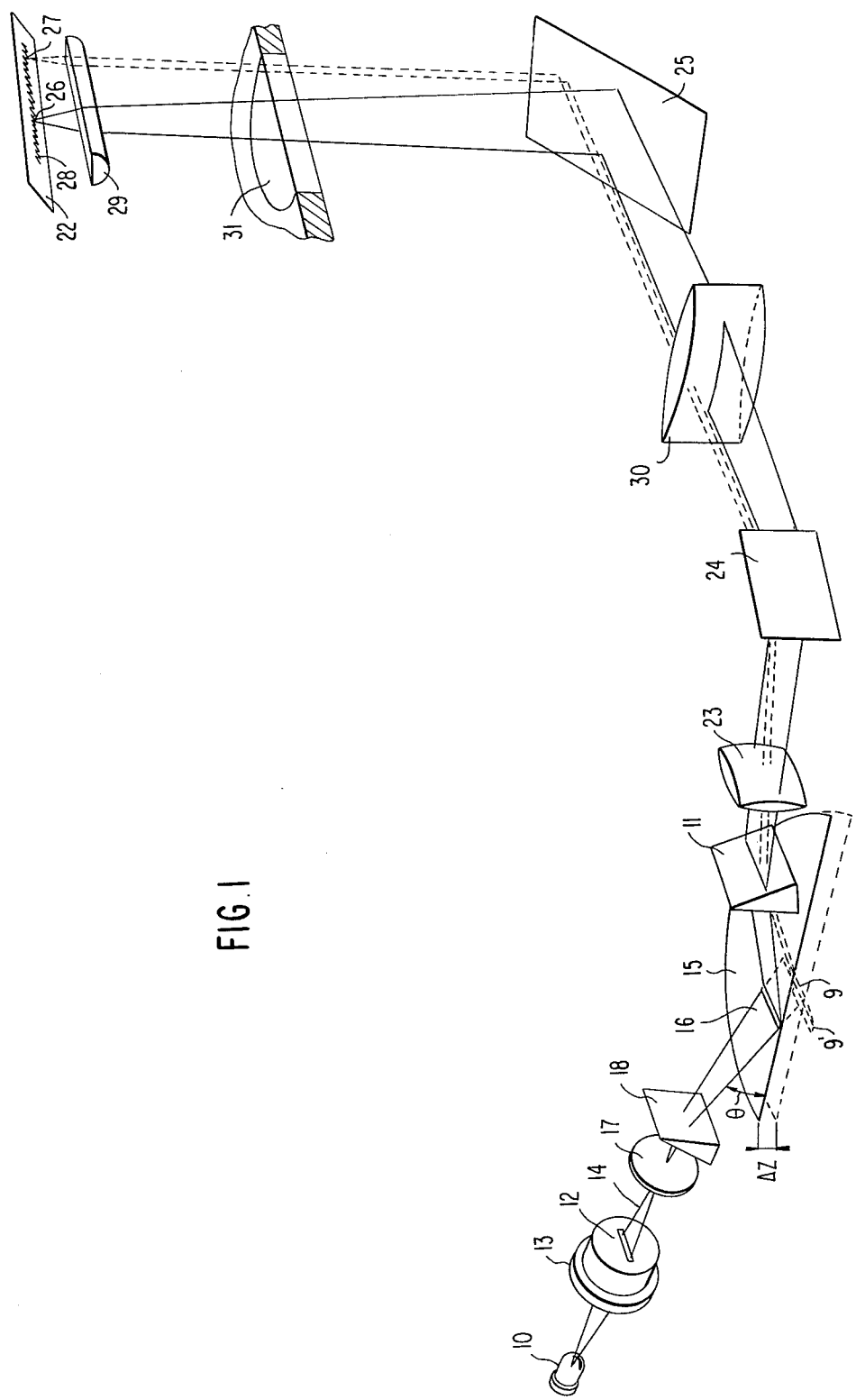
FIG. 1 is a schematic view showing the optical system for measuring the z-position of the target surface.

Referring now to FIG. 1, the optical subsystem used to measure z-position of a target surface is illustrated. The system basically incorporates "light lever" techniques adapted specifically to the particular conditions unique to an E-beam exposure tool. For example, the optical system must not interfere with the E-beam and E-beam sensors and must emit light in a part of the spectrum to which the resist on the mask is insensitive. The system must also be high vacuum compatible and not contain ferromagnetic materials or bulk conductors which tend to generate Eddy currents. Of crucial importance is that the optical system have a demonstrated reproducible accuracy of 2 $\mu$m or less. These criteria of E-beam use are satisfied by the optical system shown in FIG. 1.

A light source 10 is preferably an LED emitting at $\lambda > 600$ $\mu$m generally, monochromatic red light. The source also has a small beam divergence, preferably less than 5° referenced to 50% intensity angle. The source 10 illuminates a horizontal slit 12 by virtue of a condensor lens 13. The emitted light beam 14 is parallel to the target plane 15 to minimize vertical space requirements within the E-beam column. The target plane 15 may be either the top surface of a wafer or mask. Since typically at early stages in processing the wafer can be blank and the mask typically uses chromium, contrast generation is virtually impossible. Accordingly, the present invention does not rely on any contrast generation properties of the target in the measurement of its surface height relative to a reference point.

The slit 12 is imaged onto the center 16 of the target surface 15 at a very shallow angle, $\theta$. If for example the target surface is coated with an optically transparent material such as resist, a high portion of the light so imaged will be reflected from the surface. The effect of the reflectivity of the coated material underneath is consequently reduced.

As shown in FIG. 1, variations of the z-position of the target surface 15 by $\times \Delta z$ cause the focused slit image 6 to move vertically to the position 9' while the focus of reflection moves laterally on the surface to position 9 and delineate an apparent raising or lowering of the center of the reflected beam 16 by $2 \times \Delta z$. That is as shown in the dotted line representation, 9' represents the shift of the slit image 9.

As shown in FIG. 1, the light beam 14 which is parallel to the target plane 15 is imaged onto the center of the target surface by means of a focusing lens 17 and a deflecting prism 18. In a corresponding manner, the slit image is redeflected into the horizontal position by means of a corresponding prism 11 and a lens 23. The use of the prisms 11 and 18 minimizes the vertical space requirement in the system. Lens 23 is used to image the slit image onto the sensor plane 22.

The space constraints dictated by the E-beam column and chamber may require that the beam be reflected several times before it reaches the sensor plane. As shown in FIG. 1, this can be accomplished by the use of turning mirror 24 and 25 which may be adjustable for adjustment of the beam to the center of the sensor plane 22 at a nominal height of the target plane (i.e., $\Delta z = 0$). Accordingly, a magnified image 26 of the primary slit image 9 is produced in the sensor plane 22 focused in the direction along the diode array and concentrated (intensified) in the direction across the diode array having a position which moves by $2 \times$ the magnification multiplied by the height error, $\Delta z$, for example, to a position 27.

FIG. 1 also shows a pair of cylinder lenses 29 and 30 which serve to concentrate the light across the diodes of the array. As is appreciated from FIG. 1, focusing is only necessary in the direction along the diode array. The light beam leaves the vacuum chamber through light port 31 disposed in the chamber wall as shown in the Figure. The diode array is therefore located outside the vacuum to facilitate electrical installation, that is, using short leads and positional adjustments.

The light lever assembly of FIG. 1 departs from the prior art by not utilizing a servo feedback loop. In prior art systems, such a loop would be used to return the slit image 27 produced on the sensor plane 22 to its nominal position 26 by means of mechanical or electrical activation of optical elements, for example, the rotation of prisms or mirrors. In contrast, in the system of FIG. 1, the sensor array comprising a linear diode array 28 senses the position of the slit image and converts it into an electrical signal. This electrical signal is utilized as a video signal at its output. The significance of the linear diode array 28 is the elimination of actuators which would be necessary inside the vacuum of the E-beam column as in the case of prior art devices. Moreover, because there are no mechanical elements in any feedback loop, the system of the present invention operates at a significantly faster rate.

Figure 2:
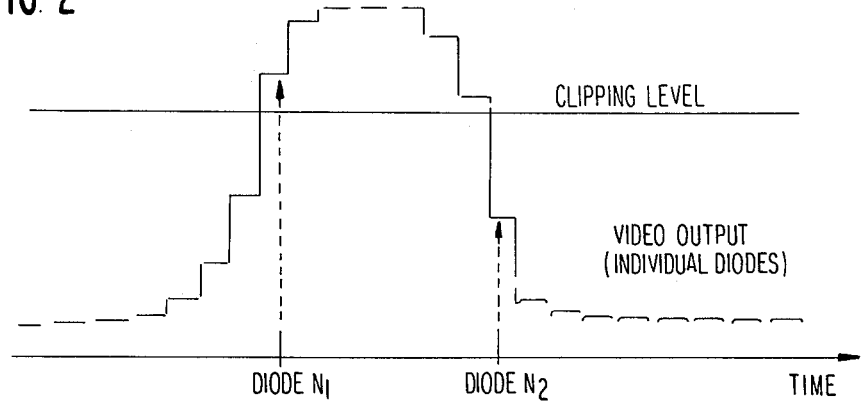
FIG. 2 is a diagram showing video output signal of the diode array as a function of time.
Figure 2:
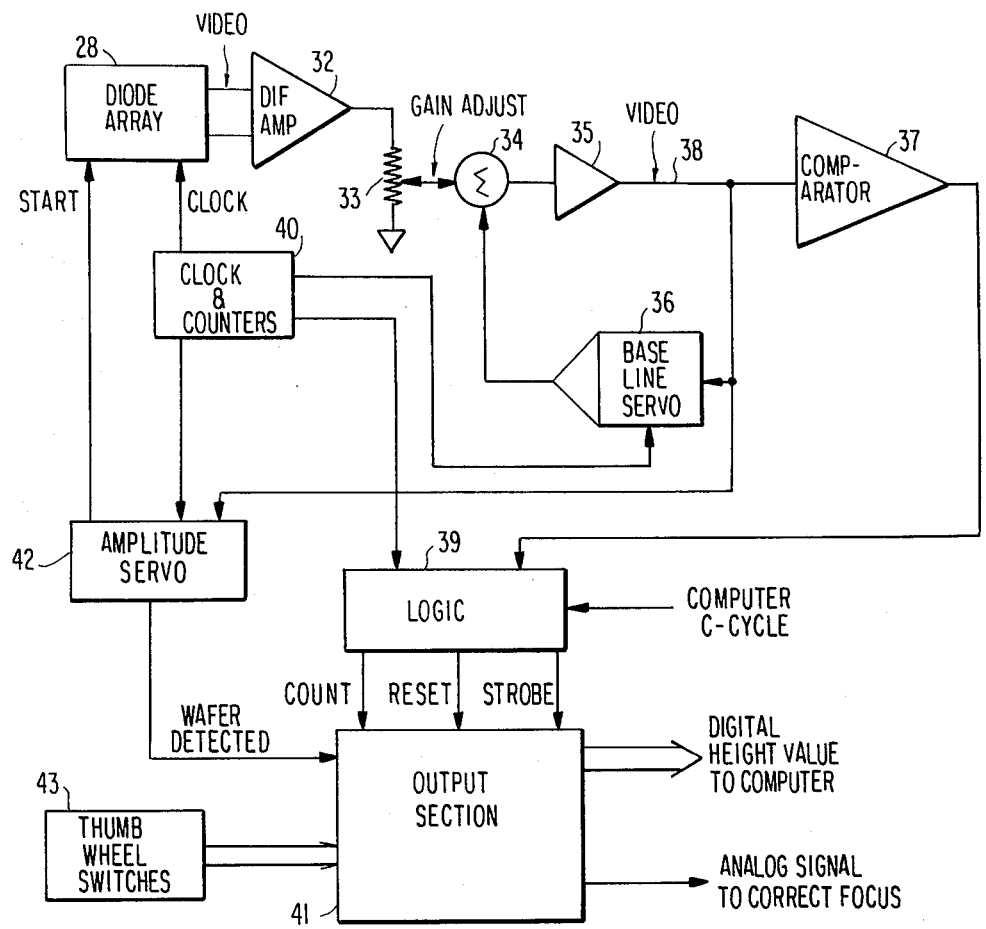

Referring now to FIG. 2, a typical video output of the diode array 28 is shown. As will be discussed with respect to FIG. 3, the output from the diode array has a clipping level established by means of a comparator to determine which of the diodes in the array, for example, diode N1, corresponds to the leading edge of the light beam and which diode, N2, corresponds to the trailing edge of the light beam. The electronic subsystem utilizes the output of the diode array, as shown in FIG. 2, and converts that output into signals needed for correcting the E-beam focus and deflection. Moreover, the electronic subsystem of FIG. 3 adjusts the signal magnitude to compensate for varying conditions, such as, a varying reflectivity of the target surface.

Referring now to FIG. 3, the autofocus electronics subsystem of this invention is shown. The video output signal from the array, as shown in FIG. 2, is initially fed to a differential amplifier 32 and then to a gain adjusting control resistor 33. A base line servo correction 36 is then added to the video signal at the summing junction 34 of the amplifier 35.

The base line servo 36 is required to correct for DC offset drift in the amplifiers 32 as a result of the large DC gain necessary to amplify the small diode signal and raise it to a level that can be processed by the comparators of the FIG. 3 network. The resulting video output signal 38 is then identical to that in FIG. 2 where the clipping level is used by a comparator 37 to determine which diode (N1) corresponds to the leading edge of the light beam and which (N2) corresponds to the trailing edge of the light beam shown in the output of FIG. 2.

The system of FIG. 3 utilizes the logic circuits 39 receiving the comparator 37 output and secondly the output from the clock 40 to generate a count equal to the number of diodes from the beginning of the diode array to the center of the light beam. An output section 41 receives the count together with a reset signal and a strobe signal.

The output section 41 performs multiple functions. First, it converts the serial count from the logic 39 into a parallel output word sent to a controller computer, not shown. Also, the output section employs a digital-to-analog converter to produce an analog output used to directly correct the E-beam focus. These two outputs are indicated by FIG. 3.

The values of height which are transmitted to the computer and to the focus coil driver of the E-beam assembly are periodically updated when pulses occur on the strobe and reset lines.

FIG. 3 shows an input-to-logic 39 in the form of "computer" C-cycle. This input indicates that the E-beam system is in a table move mode and accordingly the system is at a point in operation where updating of the autofocus outputs can occur. In the table move mode, there is neither writing nor registration of the system but rather a physical adjustment is being made to the specimen which permits updating of the autofocus outputs. Accordingly, utilizing the C-cycle input to the logic section 39, updating occurs at a point in the processing where there is no substantive E-beam operation.

FIG. 3 shows an amplitude servo 42 receiving respective inputs from the clock and counters 40 and the base line servo 36. The amplitude servo 42 is utilized to compensate for different levels of reflectivity due to different resists and different structures on the wafers. The amplitude servo 42 is also used to compensate for drift in the LED light output and amplifier gain drift. The amplitude servo 42 is further used to measure the output of the strongest diode and determine whether it is the proper amplitude. If the output is too low, the amplitude servo 42 increases the time between start pulses sent to the diode array. An increase in time between start pulses allows the diodes in the array 28 to receive light for a longer period of time, and therefore have a larger signal when ultimately read out. Conversely, if the signal is too large, the time between start pulses is decreased, which results in a decrease in output amplitude. If the amplitude servo 42 does not detect a signal, then, an output is delivered to the output section 41 indicating that a wafer is not present. As a result, the output section switches to preprogrammed default values which are stored in thumbwheel switches 43.

An alternative technique of adjusting the varying light level is to employ a gold-coated photo diode as one of the mirrors 24 or 25 and to control the current of the illuminating LED by using a feedback amplifier. As such, the signal into the photo diode is restored to the same level. In such a modification, the adjustment cycle in the video circuit may be eliminated.

As shown in FIG. 3, the output section 41 provides a digital output to the computer controller representing the measured height of the chip which is being written. The computer then uses this value to compute and apply corrections to the magnification and rotation of the magnetic deflection corresponding to the measured height during unregistered reading.

Also, as shown in FIG. 3, the output section 41 provides an analog signal which is used to directly and automatically correct the E-beam focus for different heights of each chip on the wafer. The multiple outputs provided by the output section 41 therefore eliminate the conventional servo loop rebalance since direct height measurements are made and corresponding analog signals are utilized to correct the focus. The system therefore automatically corrects the focus of an electron beam, matching the actual target plane prior to the registration and writing of each integrated circuit chip. Moreover, because height changes are directly sensed, correction for rotation and magnification errors due to those height changes prior to the writing of each chip can occur.

The present invention is also significant in that it is not dependent on registration of the chip. It therefore can correct for focus rotation and magnification during a blind writing operation.

Additionally, the present invention offers significant advantages in that it utilizes monochromatic red light from the LED 10 which therefore allows the use of prisms 11 and 18 to bend the light down to the surface of the wafer and bend the light back to the proper plane after it has been reflected off the wafer surface. Such light is in the part of the spectrum that will not affect the resist. As will be appreciated, in the context of a E-beam column this technique allows accommodation of the optical sub-system within a minimum of vertical space. As such, it greatly simplifies the optical beam alignment allowing a more rugged construction therefore preventing exposure of the resist. Also, low light losses are achieved by the use of such prisms and yet separation of the focusing in one direction from the light concentration in the other direction is also achieved by the use of properly spaced cylindrical lenses 29 and 30 together with goldcoated mirrors 24 and 25. As such, the light lever converts height variations of the wafer surface 15 into movements of a light spot on a position sensitive sensor, such as the linear diode array 28. Therefore, the optical subsystem offers significant advantages over the prior art. Since feedback is not used in this invention but rather simultaneous measurement and its utilization for focus correction, the system must be calibrated. This is accomplished using two targets of a different but not necessarily known height features which permit assessment of the correct E-beam focus. For each of the two heights best E-beam focus is achieved by adjusting the gain and offset of the analog output amplifier. Since the focus current (or voltage in the electrostatic case, is proportional to the height error $\Delta z$, this two-point calibration provides the correct E-beam refocussing for any height variation.

Moreover, as pointed out herein, the electronic subsystem employs a time-varying servo to maintain a constant signal amplitude in the diode array 28. The servo therefore compensates for differences in reflectivity of the mask or wafer surface and of the various resists which may be used as coatings. Moreover, it corrects for all other drifts of gain of amplitude to provide for constant amplitude inputs to the logic portion of the subsystem.

It is apparent that changes and modifications of this invention may be made without departing from the essential aspects of this invention.

We claim:

1. An E-beam autofocusing system for correcting E-beam focus as a function of variations between a target surface and a reference point, comprising:
   a source of light;
   first optical means for projecting an image using light from said source onto said target surface;
   second optical means for redirecting said image from said target surface onto an image plane;
   transducer means positioned on said image plane receiving said image and producing an electronic output signal indicative of the height of said target surface relative to said reference point; and
   circuit means coupled to said transducer means for converting said electronic output signal into a focus correction signal for said E-beam.

2. An E-beam autofocus correction system for measuring the position of a target surface relative to a reference point comprising:
   a source of light;
   first optical means directing a light image from said source onto said target surface and second optical means redirecting said light image reflected from said target surface onto an image plane;
   transducer means on said image plane converting said light image into an electronic output signal; and
   circuit processing means receiving said electronic output signal and providing an E-beam focus correction signal.

3. The system of claim 1 or 2 further comprising slit means receiving light from said source, said slit means positioned horizontal to the plane of said target surface; and said first optical means comprising a prism for directing an image of said slit onto said target surface at a shallow angle.

4. The system of claim 3 wherein said second optical means comprises a prism for redirecting the image of said slit into a horizontal position.

5. The system of claim 3 wherein said second optical means comprises a lens system for magnifying said redirected image onto said image plane.

6. The systems of claim 1 or 2 wherein said transducer means comprises a linear diode array, said linear diode array producing a pulse output signal indicative of the position of said image on said array.

7. The system of claim 1 or 2 wherein said circuit means comprises servo and gain adjust means receiving said output signal and adjusting it for signal processing, and signal processing means receiving said adjusted signal and determining the height of said target plane to said reference point, said signal processing means producing an analog output to said E-beam for correcting focus and a digital output signal indicative of said height measurement to a controller.

8. The system of claim 7 wherein said circuit means further comprises an amplitude servo receiving said adjusted signal and determining whether said output signal from said transducer means is of proper amplitude, said amplitude servo producing an output for varying the read time of said transducer means to adjust the time said image is received by said transducer prior to producing said output signal.

9. The system of claim 6 wherein said circuit means comprises servo and gain adjust means to adjust said pulse output signal and determine which pulses constitute diode outputs of a leading edge of said light image and a trailing edge of said light image, logic means to generate a count equal to the number of diodes from a first diode to the center of said light image, and output signal processing means receiving said count and determining the height of said target plane to a reference point, said output signal processing means producing an analog focus correction signal to said E-beam and a digital signal indicative of height measurement to a controller.

10. The system of claim 9 wherein said circuit means further comprises an amplitude servo receiving said adjusted pulse output signal and compensating for drift in said diode array by adjusting the time between readout of said diode array.

11. The system of claim 1 or 2 wherein said light source comprises an LED transmitting monochromatic red light.

* * * * *